United States Patent
Wu et al.

(10) Patent No.: US 11,923,231 B2
(45) Date of Patent: Mar. 5, 2024

(54) SUBSTRATE TABLE WITH VACUUM CHANNELS GRID

(71) Applicant: TAIWAN SEMICONDUCTOR MANUFACTURING COMPANY, LTD., Hsinchu (TW)

(72) Inventors: Min-Cheng Wu, Taitung County (TW); Chi-Hung Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 252 days.

(21) Appl. No.: 17/375,618

(22) Filed: Jul. 14, 2021

(65) Prior Publication Data

US 2021/0343575 A1 Nov. 4, 2021

Related U.S. Application Data

(62) Division of application No. 15/821,971, filed on Nov. 24, 2017, now Pat. No. 11,081,383.

(51) Int. Cl.
| | |
|---|---|
| *H01L 21/687* | (2006.01) |
| *B25B 11/00* | (2006.01) |
| *H01L 21/67* | (2006.01) |
| *H01L 21/683* | (2006.01) |

(52) U.S. Cl.
CPC ........ *H01L 21/6838* (2013.01); *B25B 11/005* (2013.01); *H01L 21/67248* (2013.01); *H01L 21/67288* (2013.01); *H01L 21/6875* (2013.01)

(58) Field of Classification Search
CPC ............ H01L 21/6875; H01L 21/6838; H01L 21/6831; H01L 21/67248; H01L 21/67288; G03F 7/707; B25B 11/005
See application file for complete search history.

(56) References Cited

U.S. PATENT DOCUMENTS

| | | | |
|---|---|---|---|
| 2004/0036850 A1* | 2/2004 | Tsukamoto | ............. G03F 7/707 355/75 |
| 2004/0123805 A1 | 7/2004 | Tomoyoshi | |
| 2007/0222131 A1* | 9/2007 | Fukumoto | ........... H01L 21/6875 269/21 |
| 2007/0252970 A1 | 11/2007 | Shibazaki | |
| 2008/0111984 A1 | 5/2008 | Shibuta | |
| 2008/0165330 A1 | 7/2008 | Mizutani | |
| 2008/0175999 A1 | 7/2008 | Kawaji et al. | |
| 2010/0059904 A1 | 3/2010 | Kasumi | |
| 2012/0139192 A1* | 6/2012 | Ooi | ....................... B25B 11/005 29/559 |

(Continued)

FOREIGN PATENT DOCUMENTS

KR 19980072814 A * 11/1998
WO WO 2006030908 A * 3/2006

*Primary Examiner* — Mahdi H Nejad
(74) *Attorney, Agent, or Firm* — Birch, Stewart, Kolasch & Birch, LLP

(57) ABSTRACT

A substrate table is provided. The substrate table includes a main body having a surface and a plurality of burls extending from the surface. The burls are configured to support a substrate on the main body. The substrate table further includes a number of vacuum channels provided in the burls to apply a vacuum to the substrate. The vacuum channels are distributed throughout the main body and arranged in a grid pattern.

20 Claims, 17 Drawing Sheets

(56) References Cited

U.S. PATENT DOCUMENTS

| | | | |
|---|---|---|---|
| 2013/0107241 A1* | 5/2013 | Lafarre | G03B 27/60 |
| | | | 355/73 |
| 2014/0065553 A1* | 3/2014 | Jang | H01L 21/6836 |
| | | | 279/3 |
| 2015/0179495 A1 | 6/2015 | Huang | |
| 2016/0195579 A1 | 7/2016 | Simmons et al. | |
| 2018/0096878 A1* | 4/2018 | Wu | H01L 21/6838 |
| 2018/0190501 A1 | 7/2018 | Ueda | |

* cited by examiner

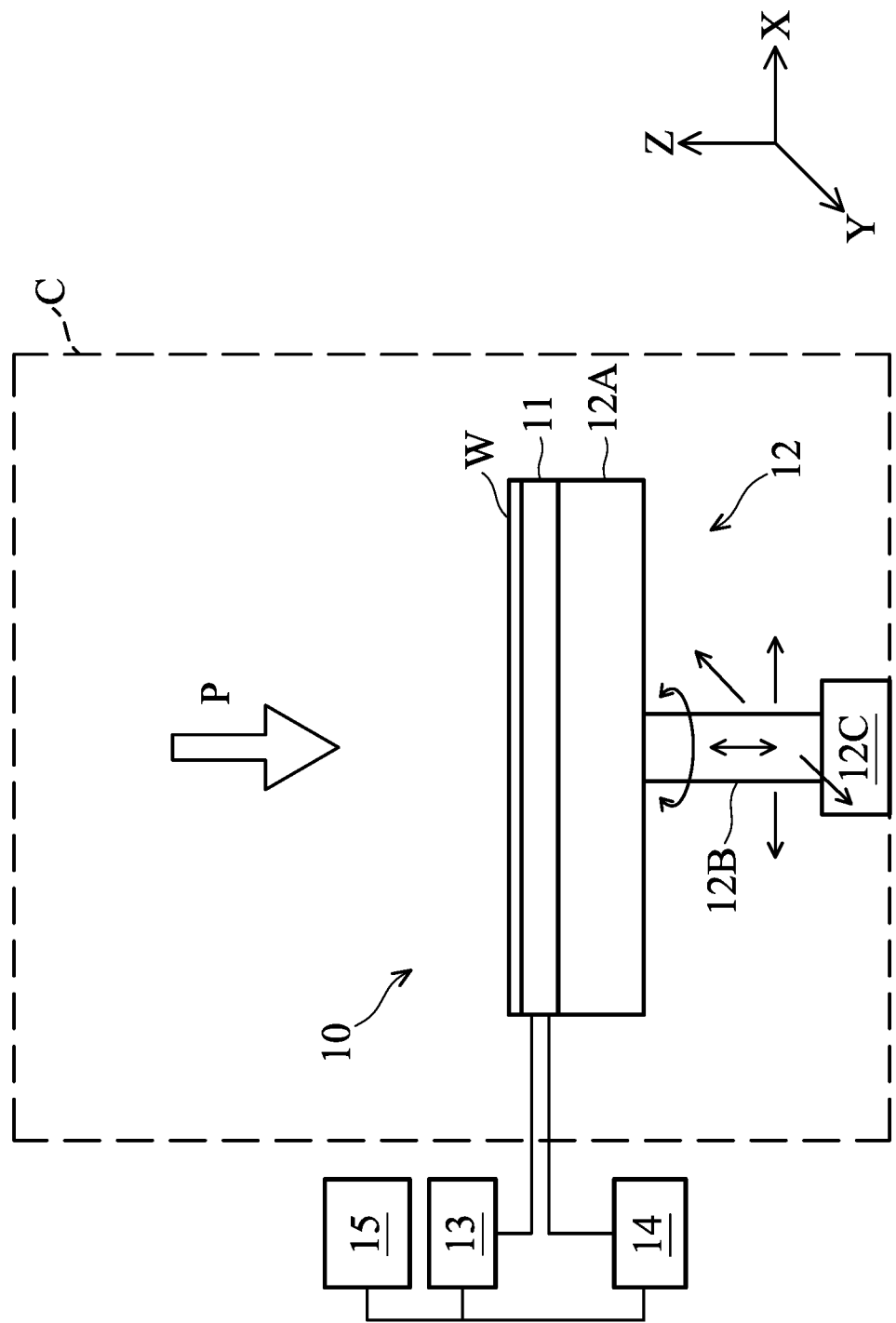

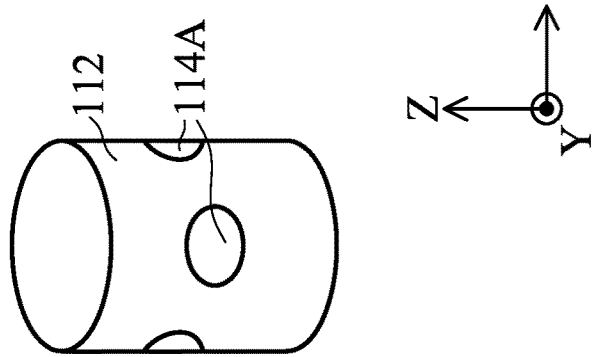
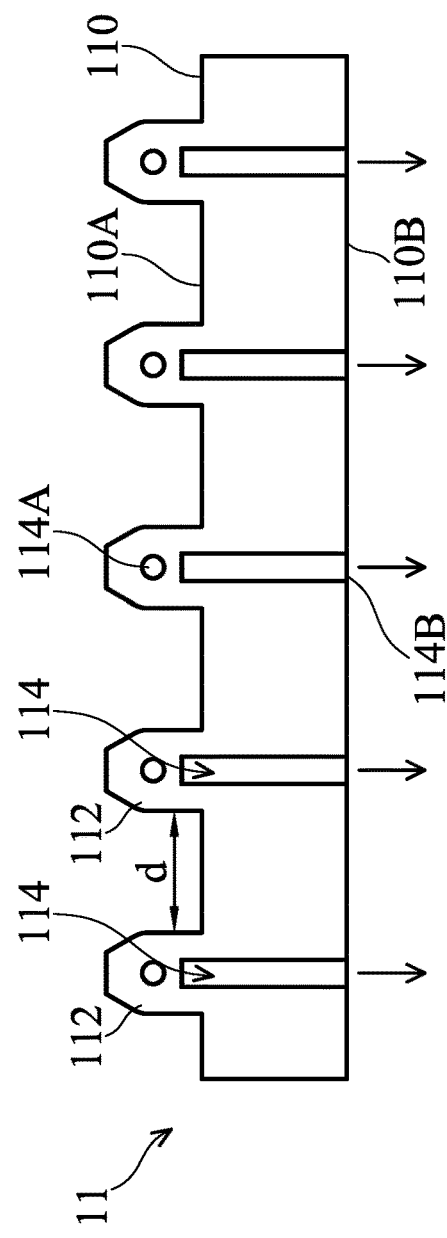
FIG. 4B

SUBSTRATE TABLE WITH VACUUM CHANNELS GRID

CROSS REFERENCE

This application is a divisional of U.S. application Ser. No. 15/821,971, filed on Nov. 24, 2017, the entirety of which is incorporated by reference herein.

BACKGROUND

The semiconductor integrated circuit (IC) industry has experienced exponential growth. Technological advances in IC materials and design have generated generations of ICs, wherein each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

Another trend in the industry has been an increase in the diameter of substrates (e.g. wafers) on which semiconductor devices are formed. Over the years, transitions have been made in the industry from 100 to 200 millimeters (mm), from 200 to 300 mm, and now from 300 to 450 mm. As the size of substrates increases, similar developments in fabrication tools are needed. For example, there is a need for a substrate table system capable of holding and/or manipulating larger substrates during various fabrication processes, such as photolithography processes, polishing processes, deposition processes, and the like.

Although existing substrate table systems have been generally adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which:

FIG. 1 schematically shows a substrate table system in accordance with some embodiments.

FIG. 4B schematically shows that the vacuum channels are provided in the burls on the substrate table in accordance with some embodiments.

DETAILED DESCRIPTION

Figure 2A:
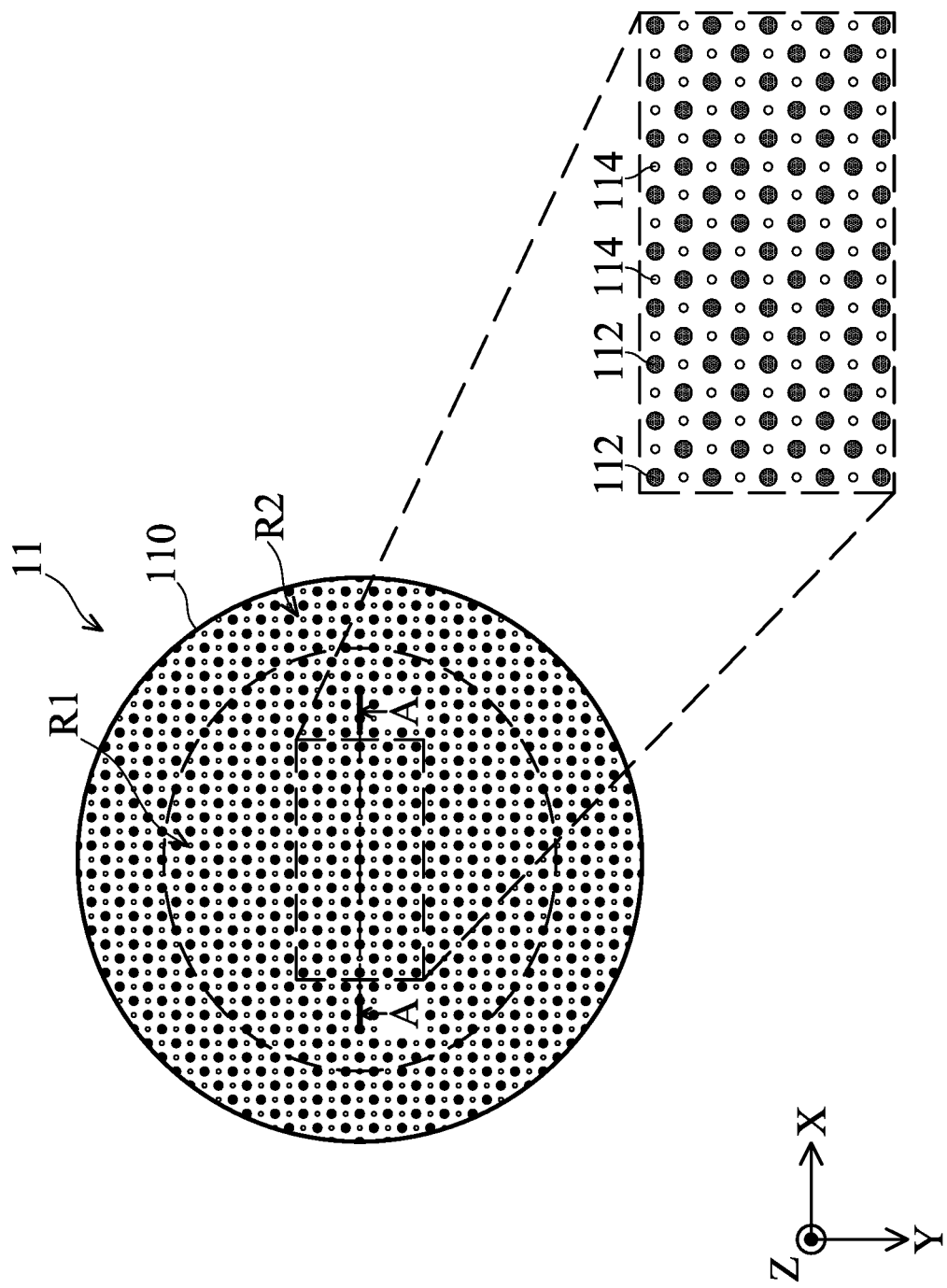
FIG. 2A schematically shows an upper surface of a substrate table in accordance with some embodiments, wherein the substrate table includes evenly distributed vacuum channels.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 schematically shows partial elements of a substrate table system 10 in accordance with some embodiments. The substrate table system 10 may be configured to hold, position, move, and otherwise manipulate a substrate W for processing in a processing chamber C of a semiconductor fabrication tool. The semiconductor fabrication tool per-forms an integrated circuit (IC) fabrication process P to form semiconductor devices on the substrate W while it is secured on the substrate table system 10. In some embodiments, the semiconductor fabrication tool may be, for example, a chemical vapor deposition (CVD) tool, a physical vapor deposition (PVD) tool, an etching tool, a thermal oxidation tool, an ion implantation tool, a chemical mechanical polishing (CMP) tool, a rapid thermal annealing (RTA) tool, a photolithography tool, a diffusion tool, or another applicable semiconductor fabrication tool.

The substrate table system 10 may be configured to hold a substrate W of arbitrary shape. A typical substrate W may be a circular wafer of various diameters including, but not limited to 200 mm, 300 mm, 450 mm, or larger. Additionally, for example, the substrate W may be a semiconductor substrate, such as a silicon substrate, a silicon germanium (SiGe) substrate, or a silicon-on-insulator (SOI) substrate. Alternatively, for example, the substrate W may have a rectangular shape, such as a flat panel or a liquid-crystal display (LCD).

The substrate W may also have various device elements. Examples of device elements that are formed in or on the substrate W include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes P may be performed to form the device elements, such as deposition, etching, implantation, photolithography, annealing, and/or other suitable processes.

As shown in FIG. 1, the substrate table system 10 includes a substrate table 11, a movable stage mechanism 12, a vacuum generation system 13, a gas supply system 14, and a controller 15. It should be appreciated that some additional elements can be added into the substrate table system 10 in different embodiments, and some of the elements described below can be replaced or eliminated in other embodiments of the substrate table system 10.

In some embodiments, the substrate table 11 is configured to support or hold a substrate W. For example, a substrate W can be transferred into and out of the processing chamber C through an opening (not shown). In addition, the substrate W can be transferred onto and off the substrate table 11 using a robotic substrate transfer system (not shown). In addition, the substrate W can be received by substrate lift pins (not shown) housed within the substrate table 11 and mechanically translated by devices housed therein. Once the substrate W is received from the transfer system described above, it can be lowered by the substrate lift pins to an upper surface of the substrate table 11. In some embodiments, the shape and/or size of the substrate table 11 correspond to those of the substrate W.

During processing, the substrate W can be secured to the upper surface of the substrate table 11. In some embodiments, the substrate table 11 grips the substrate W by a vacuum clamping force. For example, the vacuum clamping force can be generated by the vacuum generation system 13 to apply to the backside of the substrate W through a plurality of vacuum channels (which will be illustrated in more detail later) formed in the substrate table 11, so that the substrate W is secured on the substrate table 11 by vacuum clamping.

In some embodiments, the vacuum generation system 13 includes a vacuum pump, valves, pipelines, flow/pressure meters, and the like. In some embodiments, the vacuum generation system 13 further includes a pressure control module (which will be illustrated in more detail later) for controlling the vacuum pressure (i.e. the suction force) in each vacuum channel in the substrate table 11. In addition, the operation of the vacuum generation system 13 (e.g. the vacuum power of the vacuum pump) is monitored and controlled by the controller 15 (e.g., a computer system).

In some embodiments, the substrate table 11 is mounted on a carrying stage 12A of the movable stage mechanism 12. The movable stage mechanism 12 is configured to position and/or move the substrate W above the substrate table 11 during processing. For example, the carrying stage 12A can be connected to a spindle 12B, and the spindle 12B can be coupled to a driver 12C. In some embodiments, the driver 12C may be configured to drive the spindle 12B to rotate the substrate W above the carrying stage 12A and/or to move the substrate W in an X-axis direction, a Y-axis direction and/or a Z-axis direction, according to the requirements of the process. The driver 12C may include a motor, a cylinder, and the like.

In some embodiments, the gas supply system 14 is configured to supply a gas, such as a process gas (e.g. nitrogen or clean dry air (CDA)) or a heat transfer gas (e.g. helium or argon), through a plurality of gas supply channels (which will be illustrated in more detail later) formed in the substrate table 11, to the backside of the substrate W during processing. The process gas can be used to, for example, protect the backside of the substrate W from particles contamination or undesired chemical reaction (e.g. oxidation) during processing. The heat transfer gas can be used to, for example, keep or adjust the temperature of the substrate W in a desired temperature range for processing.

In some embodiments, the gas supply system 14 includes one more gas supply sources, a pump, valves, pipelines, flow/pressure meters, and the like. In some embodiments, the gas supply system 14 further includes a pressure control module (which will be illustrated in more detail later) for controlling the gas supply pressure (i.e. the pumping force) in each gas supply channel in the substrate table 11. In other some embodiments, the gas supply system 14 further includes a temperature control system (which will be illustrated in more detail later) for controlling the temperature of a heat transfer gas supplied into each gas supply channel in the substrate table 11.

In some embodiments, one or more temperature sensors (not shown) may be positioned at one or more locations on or within the substrate table 11 and can be coupled to the controller 15 to provide an indication of the temperature of different portions of the substrate table 11. The temperature of the substrate table 11 may be used to determine the temperature of the substrate W, and the controller 15 provides feedback control signal to the gas supply system 14 and its temperature control system for regulating the temperature of the substrate W during processing.

Figure 2B:
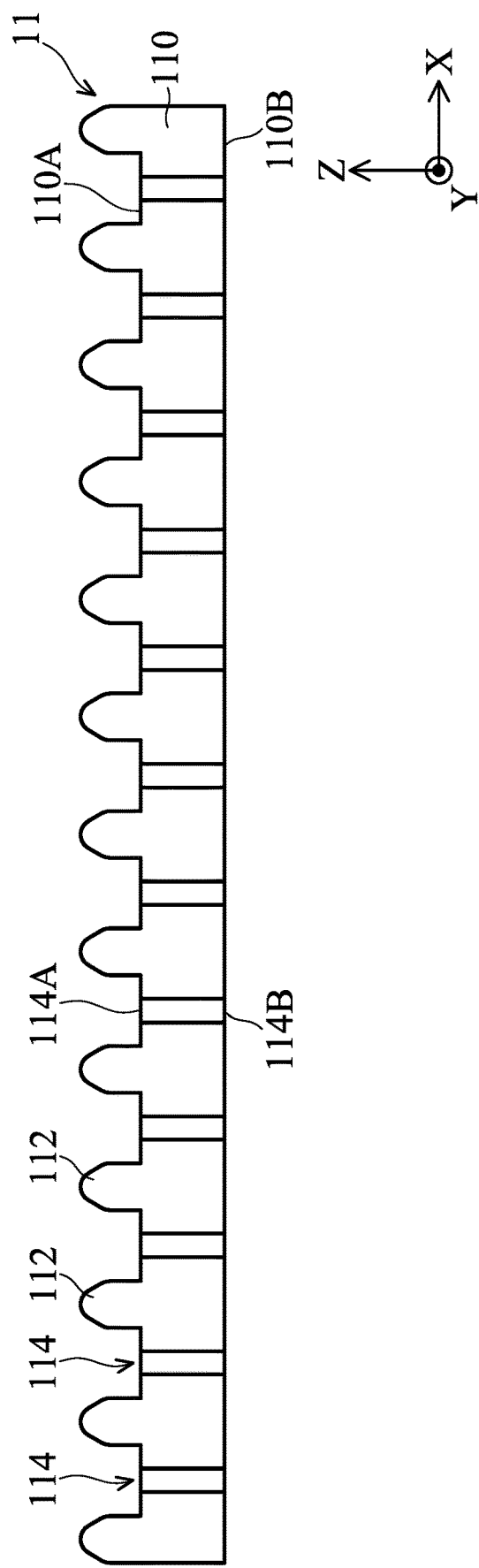
FIG. 2B is a cross-sectional view taken along line A-A in FIG. 2A.

FIG. 2A schematically shows an upper surface of a substrate table 11 in accordance with some embodiments. FIG. 2B is a cross-sectional taken along line A-A in FIG. 2A. The substrate table 11 includes a circular main body 110 configured to support a substrate W (see also FIG. 3) thereon. During processing, the main body 110 can be mounted on the carrying stage 12A of the movable stage mechanism 12 (FIG. 1) by the lower surface 110B. In addition, a plurality of burls (also known as support pins) 112 extend from the upper surface 110A of the main body 110 to support the substrate W, so that the substrate W is separated from the upper surface 110A by an appropriate distance. The burls 112 may be arranged throughout the upper surface 110A. As shown in FIG. 2A, the burls 112 may be arranged evenly on the upper surface 110A. In some embodiments, the burls 112 and the main body 110 are integrally formed in one piece, and made of ceramic material, such as porcelain or the like.

In some embodiments, the main body 110 is provided with a plurality of vacuum channels 114, as shown in FIGS. 2A and 2B. For example, each of the vacuum channels 114 may pass vertically through the main body 110 and form openings 114A, 114B on the upper surface 110A and lower surface 110B, respectively. The openings 114B on the lower surface 110B can fluidly connect to the vacuum generation system 13 (FIG. 1), and the (vacuum) openings 114A on the upper surface 110A are adjacent to the substrate W placed on the substrate table 11 (see also FIG. 3). The vacuum channels 114 as well as the openings 114A, 114B may be formed by laser drilling, for example, and may be any suitable size and shape.

The vacuum channels 114 may be distributed throughout the main body 110. As shown in FIG. 2A, the vacuum channels 114 may be distributed evenly throughout the main body 110, i.e., the vacuum channels 114 are uniformly formed in all regions (including a central region R1 and a periphery region R2 adjacent to the central region R1) of the main body 110. However, in the substrate table used in the prior art, the vacuum channels 114 are formed in a (local) annular region close to the edge of the substrate table. In some embodiments, as shown in FIGS. 2A and 2B, the vacuum channels 114 can also be formed between the burls 112 and arranged in a grid pattern (e.g. forming vacuum channels grid). For example, each vacuum channel 114 is formed between four burls 112, and vice versa. However, it should be appreciated that many variations and modifications can be made to the embodiments of the disclosure.

Figure 3:
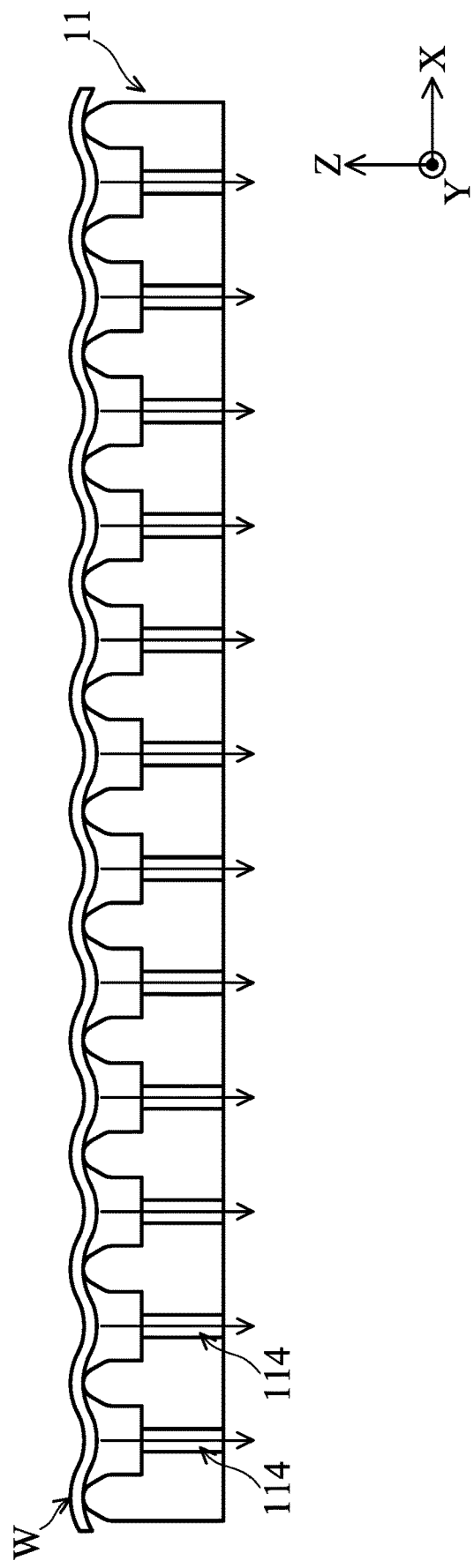
FIG. 3 schematically shows that a substrate is clamped on the substrate table of FIG. 2B.

As the vacuum channels 114 are evenly distributed throughout the main body 110, the suction forces/vacuum clamping forces from the vacuum generation system 13 (FIG. 1) applied to different portions of the backside of the substrate W, through the vacuum channels 114 and the vacuum openings 114A, can be consistent, as depicted by the downward arrows in FIG. 3. Therefore, irregular deformation of the substrate W and the stress exerted on the substrate W due to gravity and/or uneven suction forces (e.g. generated by the substrate table used in the prior art) can be reduced while the substrate W is clamped on the substrate table 11. As a result, the yield of the process P (FIG. 1) performed on the substrate W can also be improved.

It should be appreciated that many variations and modifications can be made to the embodiments of the disclosure. For example, FIGS. 4A and 4B respectively schematically show different arrangements of the vacuum channels 114 in the substrate table 11 in accordance with other some embodiments.

Figure 4A:
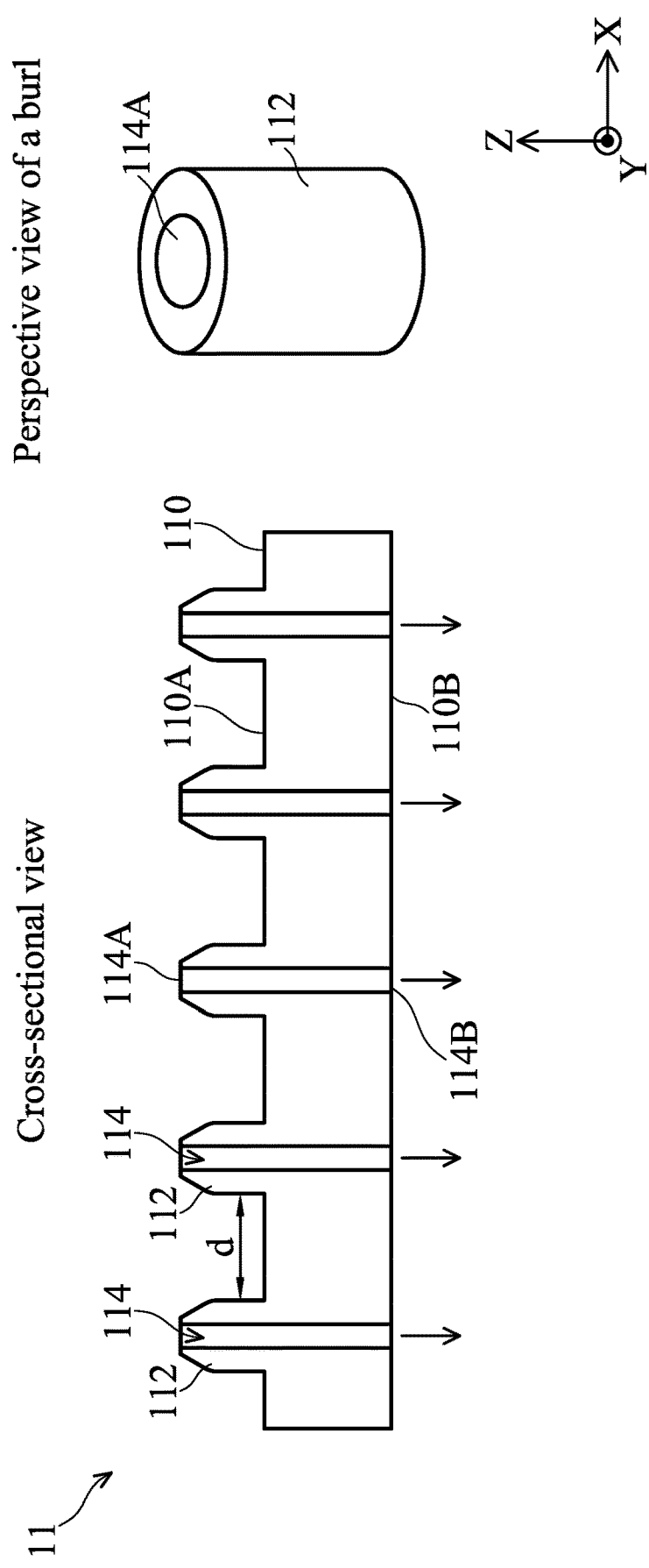
FIG. 4A schematically shows that the vacuum channels are provided in the burls on the substrate table in accordance with some embodiments.

As shown in FIG. 4A, the vacuum channels 114 are provided in the burls 112. Each of the vacuum channels 114 forms a (vacuum) opening 114A on the top surface of the respective burl 112 and an opening 114B on the lower surface 110B of the main body 110. In some embodiments, the vacuum openings 114A of the vacuum channels 114 can directly contact and apply a vacuum to the backside of the substrate W while it is clamped on the substrate table 11.

As shown in FIG. 4B, the vacuum channels 114 are provided in the burls 112. Each of the vacuum channels 114 forms at least one (vacuum) opening 114A (e.g. a number of vacuum openings 114A) on the sidewall of the respective burl 112 and an opening 114B on the lower surface 110B of the main body 110. In some embodiments, an enclosing protrusive structure (not shown) can further be provided on the outermost edge of the substrate table 11 to create or ensure a closed vacuum space between the upper surface 110A and the backside of the substrate W.

By forming the vacuum openings 114A directly in the burls 112 (i.e. the vacuum openings 114A will not occupy the spaces between the burls 112) as shown in FIGS. 4A and 4B, the distance d between two adjacent burls 112 can be reduced. Accordingly, more dense burls 112 on the substrate table 11 can be achieved, and thus the substrate W held on the burls 112 is flatter (i.e. with less irregular deformation). This also helps to improve the yield of the process P (FIG. 1) performed on the substrate W.

It should also be appreciated that the deformation of the substrate table 11 held on the carrying stage 12A (FIG. 1) may also affect the flatness of the substrate W, and thus the carrying stage 12A in some embodiments can also be provided with evenly distributed vacuum channels to clamp the substrate table 11 by vacuum clamping and avoid deformation.

Figure 5A:
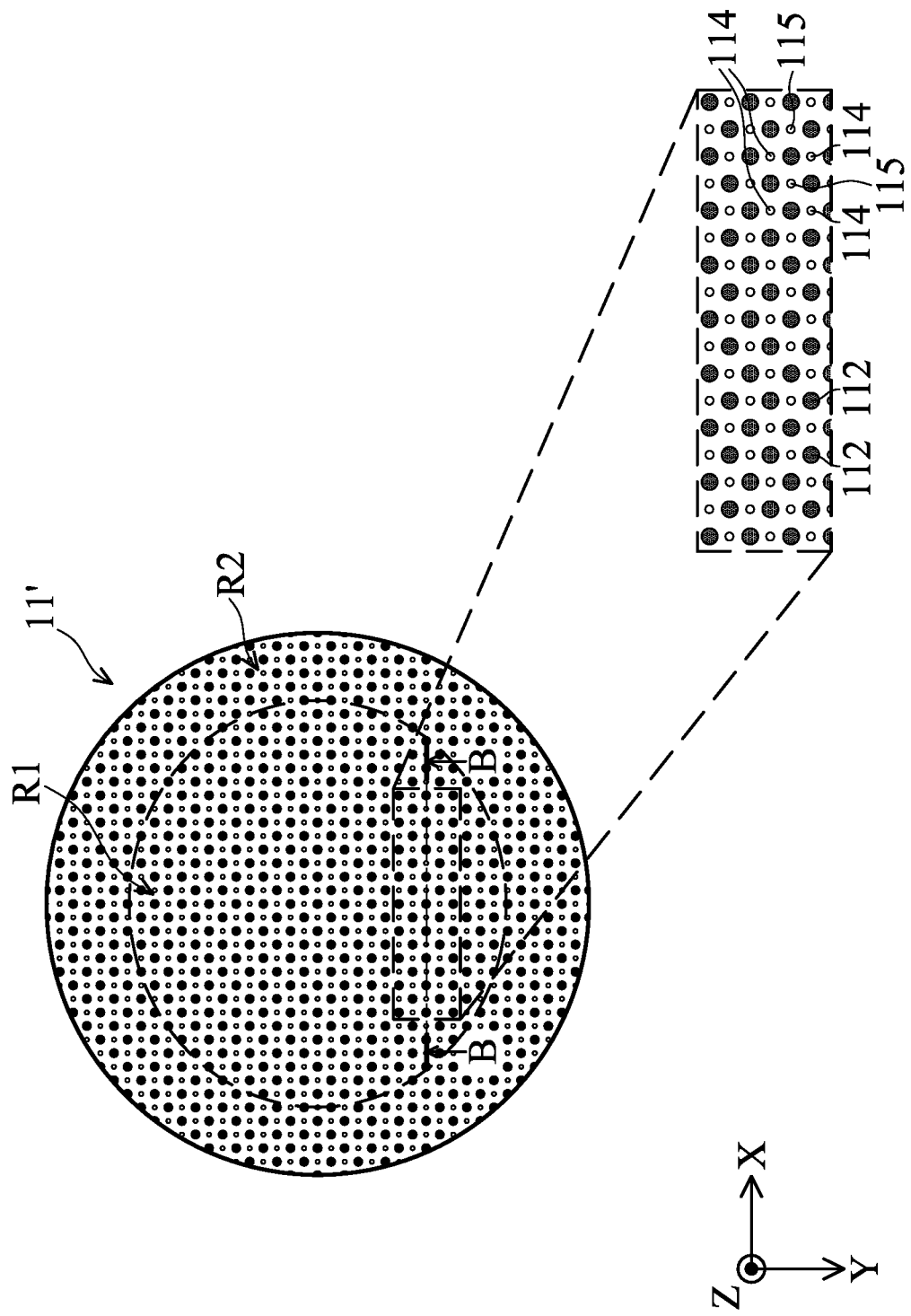
FIG. 5A schematically shows an upper surface of a substrate table in accordance with some embodiments, wherein the substrate table includes evenly distributed vacuum channels and gas supply channels.
Figure 5B:
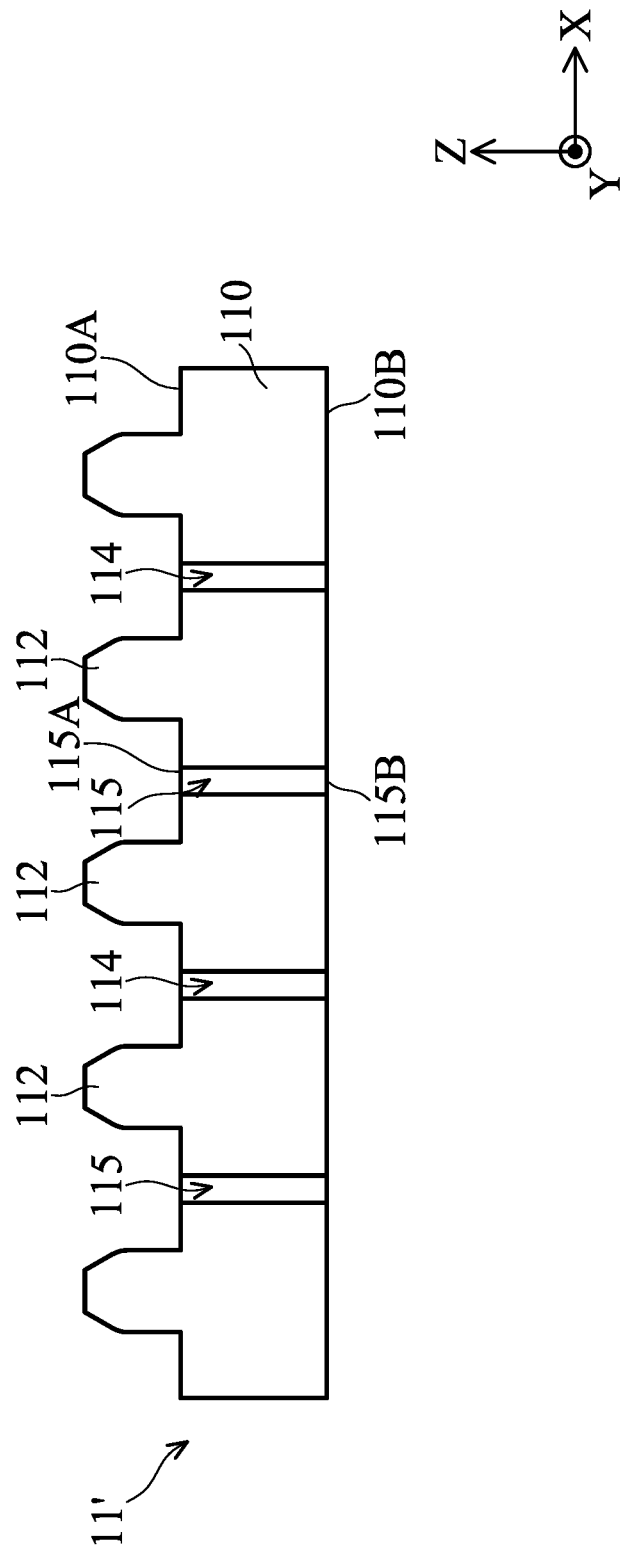
FIG. 5B is a cross-sectional view taken along line B-B in FIG. 5A.

FIG. 5A schematically shows an upper surface of a substrate table 11' in accordance with other some embodiments. FIG. 5B is a cross-sectional view taken along line B-B in FIG. 5A. The substrate table 11' differs from the substrate table 11 described above (FIGS. 2A and 2B) in that a plurality of gas supply channels 115 are further provided in the main body 110 of the substrate table 11'.

Similar to the configurations of the vacuum channels 114 described above, each of the gas supply channels 115 may pass vertically through the main body 110 and form openings 115A, 115B on the upper surface 110A and lower surface 110B of the main body 110, respectively. The openings 115B on the lower surface 110B can fluidly connect to the gas supply system 14 (FIG. 1), and the (gas supply) openings 115A on the upper surface 110A are adjacent to the substrate W placed on the substrate table 11' (see also FIG. 6). The gas supply channels 115 as well as the openings 115A, 115B may be formed by laser drilling, for example, and may be any suitable size and shape.

The gas supply channels 115 may be distributed throughout the main body 110. As shown in FIG. 5A, the gas supply channels 115 may be distributed evenly throughout the main body 110, i.e., the gas supply channels 115 are uniformly formed in all regions (including a central region R1 and a periphery region R2 adjacent to the central region R1) of the main body 110. In some embodiments, as shown in FIGS. 5A and 5B, the gas supply channels 115 can also be formed between the burls 112 and between the vacuum channels 114 and are arranged in a grid pattern. For example, each gas supply channel 115 is formed between four burls 112 and between four vacuum channels 114 (and each vacuum channel 114 is also formed between our burls 112 and between four gas supply channels 115). However, it should be appreciated that many variations and modifications can be made to the embodiments of the disclosure.

Figure 6:
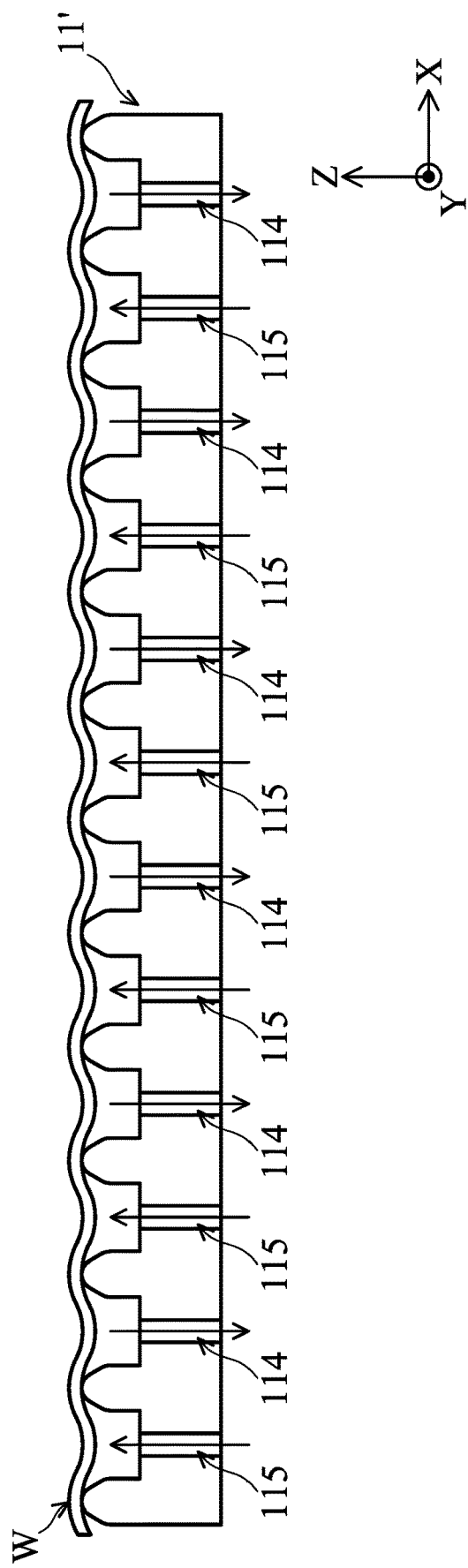
FIG. 6 schematically shows that a gas is supplied to the backside of a substrate clamped on the substrate table of FIG. 5B.

As the gas supply channels 115 are evenly distributed throughout the main body 110, the gas (e.g. a process gas or a heat transfer gas described above) supplied by the gas supply system 14 (FIG. 1) through the gas supply channels 115 and the gas supply openings 115A can be uniformly directed or dispensed to the entire backside of the substrate W, as depicted by the upward arrows in FIG. 6. It should be realized that, in such cases, the pressure of the gas (i.e. the gas supply pressure) supplied by the gas supply system 14 typically exceeds the processing pressure in the processing chamber C (FIG. 1), and thus this difference in pressure results in a net force on the substrate W outward from the upper surface 110A of the substrate table 11'. In addition, this pressure force is overcome by the vacuum generation system 13 that provides a vacuum clamping force to hold the substrate W on the substrate table 11'.

Figure 7A:
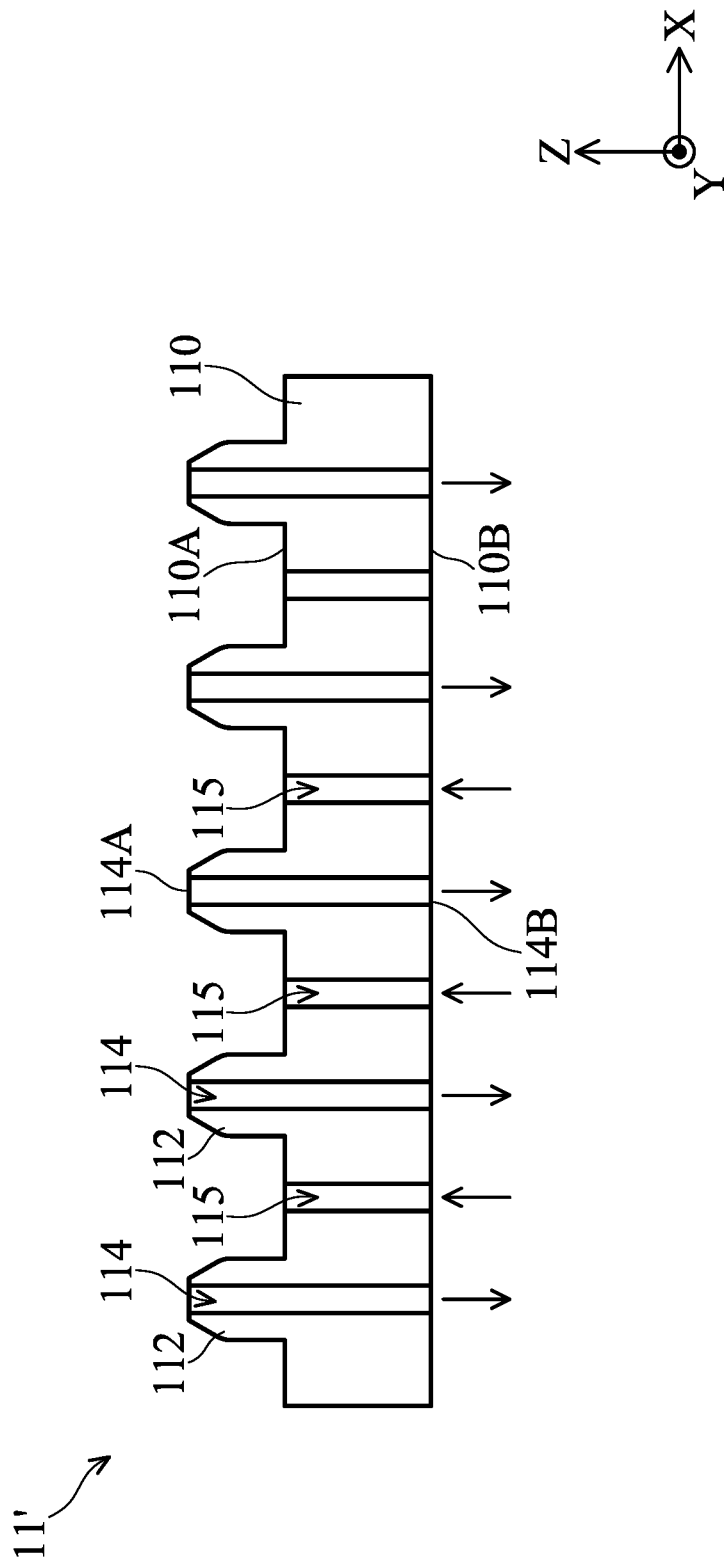
FIG. 7A schematically shows the arrangement of the vacuum channels and gas supply channels in the substrate table in accordance with some embodiments.
Figure 7B:
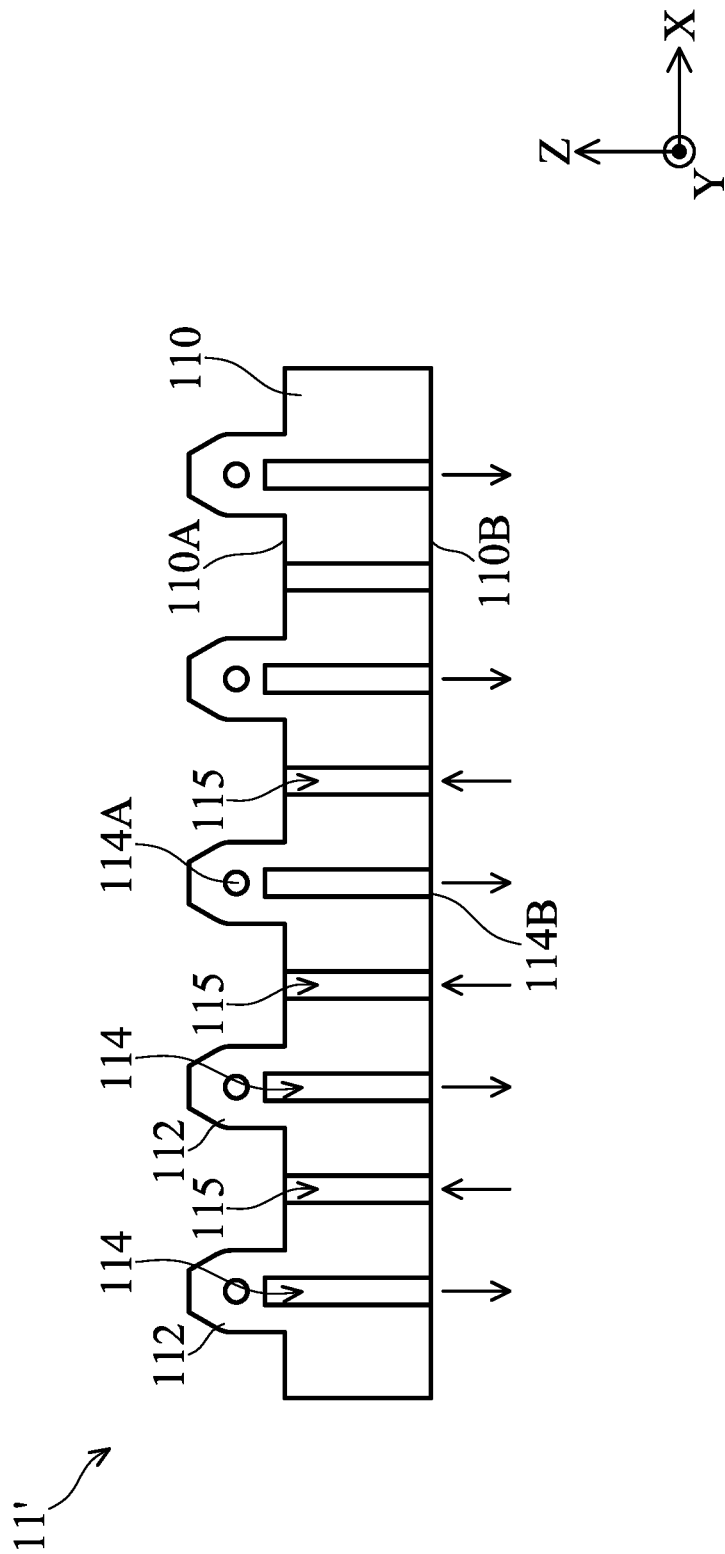
FIG. 7B schematically shows the arrangement of the vacuum channels and gas supply channels in the substrate table in accordance with some embodiments.

In some embodiments, the gas supply channels 115 can also be integrated with the substrate tables 11 described above. For example, FIGS. 7A and 7B schematically show that the gas supply channels 115 are integrated with the substrate table 11 as shown in FIGS. 4A and 4B, respectively, and provided between the vacuum channels 114 in the burls 112 of the substrate table 11'.

Figure 8:
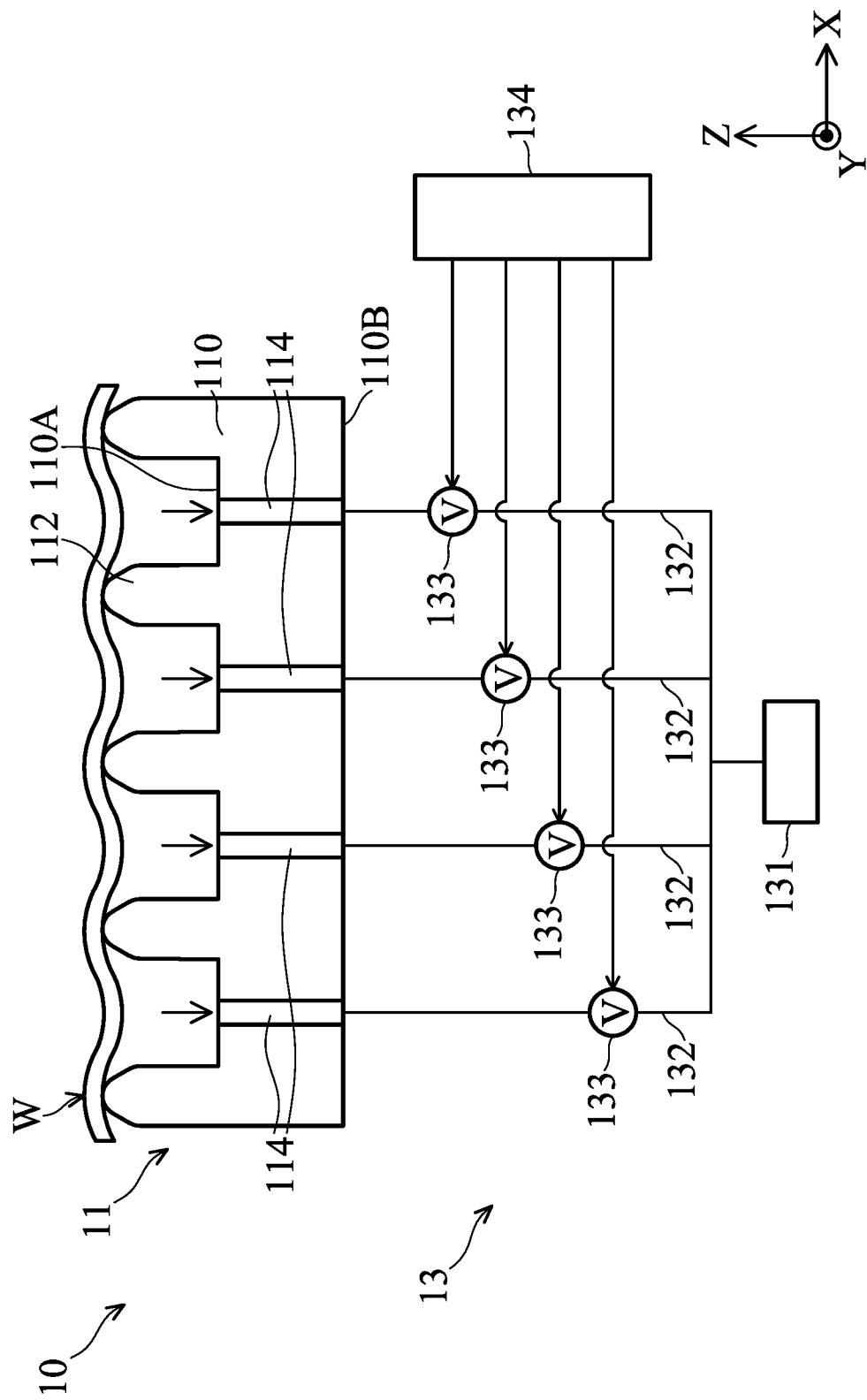
FIG. 8 schematically shows that the vacuum generation system of the substrate table system further includes a pressure control module in accordance with some embodiments.

FIG. 8 schematically shows that the vacuum generation system 13 of the substrate table system 10 (FIG. 1) further includes a pressure control module in accordance with some embodiments. As described above, the vacuum generation system 13 may further include a pressure control module for controlling the vacuum pressure (i.e. the suction force) in each vacuum channel 114 in the substrate table (e.g., the substrate tables 11 in FIGS. 2A-2B and 4A-4B). For example, as shown in FIG. 8, the vacuum generation system 13 includes a vacuum pump 131 a number of pipelines 132, a number of valves 133, and a (first) pressure control module 134. It should be appreciated that the number of the pipelines 132, the valves 133, and the vacuum channels 114 of the substrate table 11 depicted in FIG. 8 are reduced for the purpose of simplicity and clarity.

The vacuum pump 131 connects to the vacuum channels 114 of the substrate table 11 through the pipelines 132, and can apply a vacuum to the backside of the substrate W through the vacuum channels 114. The valves 133 (e.g. electromagnetic valves) are respectively provided in the pipelines 132. The valves 133 can be switchable to control the communication between the vacuum pump 131 and the vacuum channels 114, and can be adjustable to control the flow rate of the gas in the pipelines 132. Although not shown, each pipeline 132 is provided with a flow meter to detect the flow rate of the gas (i.e. the pressure) therein and the flow meter can provide the detected information to the pressure control module 134.

In some embodiments, the pressure control module 134 is coupled to the valves 133 and can independently control each valve 133 (e.g. the switch or valve opening size thereof) to change the flow rate of the gas flowing in the respective pipeline 132. Therefore, the flow rate of the gas (i.e. the suction force/vacuum pressure) in each vacuum channel 114 can also be controlled or adjusted by the pressure control module 134 according to different processing requirements and/or substrate conditions, which will be illustrated in more detail later. In some embodiments, the pressure control module 134 includes a programmable logical controller (PLC) circuit, storage members (e.g. memories), and the like.

Figure 9:
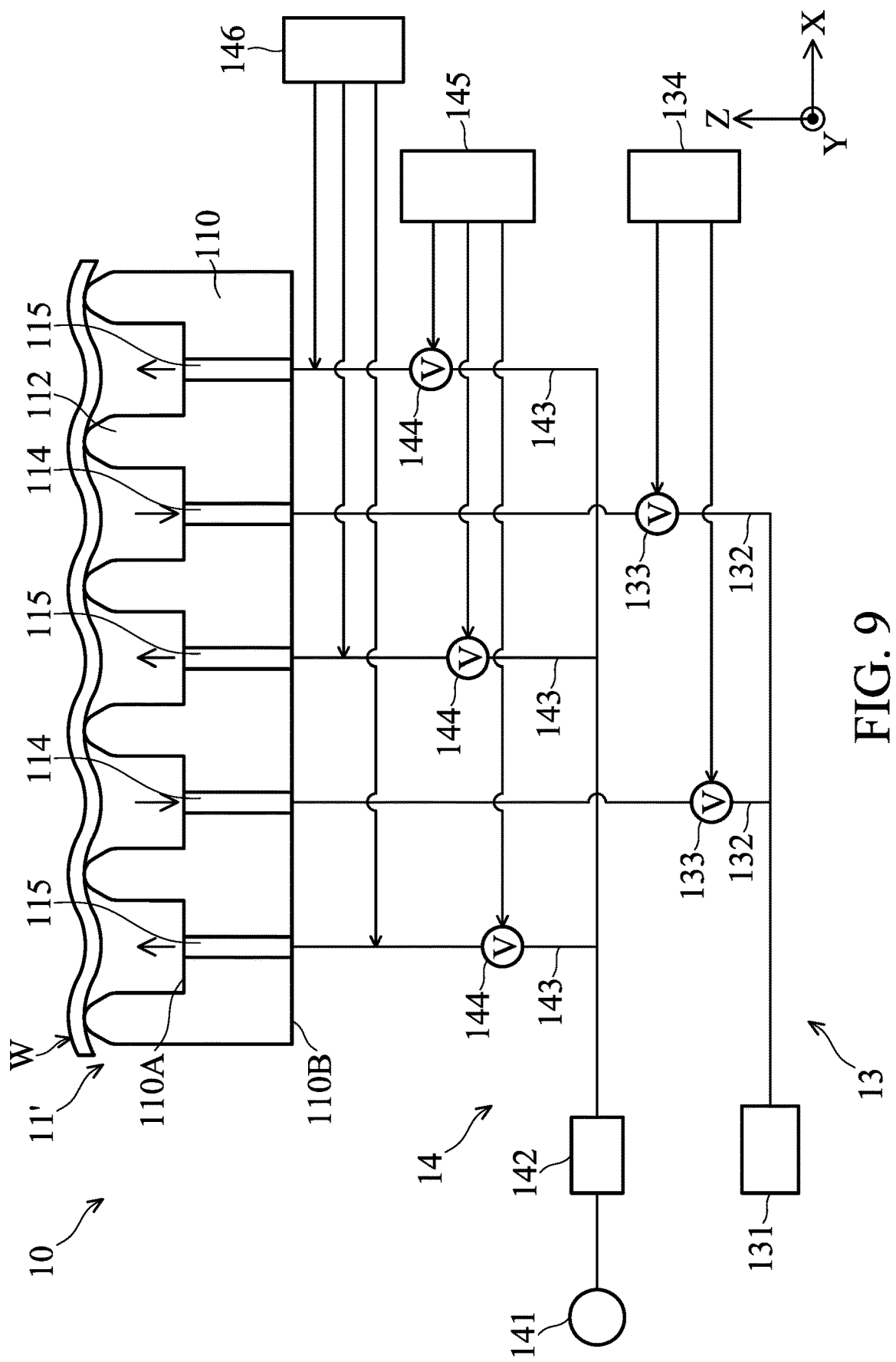
FIG. 9 schematically shows that the gas supply system of the substrate table system further includes a pressure control module and a temperature control system in accordance with some embodiments.

FIG. 9 schematically shows that the gas supply system 14 of the substrate table system 10 (FIG. 1) further includes a pressure control module and a temperature control system in accordance with some embodiments. As described above, the gas supply system 14 may further include a pressure control module for controlling the gas supply pressure in each gas supply channel in the substrate table (e.g., the substrate tables 11' in FIGS. 5A-5B and 7A-7B) and a temperature control system for controlling the temperature of the gas (e.g. heat transfer gas) supplied into each gas supply channel. For example, as shown in FIG. 9, the gas supply system 14 includes a gas supply source 141, a pump 142, a number of pipelines 143, a number of valves 144, a (second) pressure control module 145, and a temperature control system 146, in some embodiments. It should be appreciated that the number of the pipelines 143, the valves 144, and the gas supply channels 115 of the substrate table 11' depicted in FIG. 9 are reduced for the purpose of simplicity and clarity. In addition, the configuration of the vacuum generation system 13 is similar to the embodiments (FIG. 8) described above and is thus not repeated here.

The gas supply source 141 is configured to store a gas (e.g., a process gas or a heat transfer gas) that is to be supplied to the backside of the substrate W held on the substrate table 11' during processing. The gas supply source 141 connects to the gas supply channels 115 of the substrate table 11' through the pipelines 143. The pump 142 is configured to receive the gas from the gas supply source 141 and pump it to the gas supply channels 115 through the pipelines 143. The valves 144 (e.g. electromagnetic valves) are respectively provided in the pipelines 143. The valves 144 can be switchable to control the communication between the pump 142 and the gas supply channels 115, and can be adjustable to control the flow rate of the gas in the pipelines 143. Although not shown, each pipeline 143 is provided with a flow meter to detect the flow rate of the gas (i.e. the pressure) therein and the flow meter can provide the detected information to the pressure control module 145.

In some embodiments, the pressure control module 145 is coupled to the valves 144 and can independently control each valve 144 (e.g. the switch or valve opening size thereof) to change the flow rate of the gas flowing in the respective pipeline 143. Therefore, the flow rate of the gas (i.e. the pumping force/gas supply pressure) in each gas supply channel 115 can also be independently controlled or adjusted by the pressure control module 145. In some embodiments, the pressure control module 145 includes a PLC circuit, storage members (e.g. memories), and the like.

In some embodiments, the temperature control system 146 is coupled to the pipelines 143 and can independently control the temperature of the gas (e.g. a heat transfer gas) flowing in each pipeline 143. For example, the temperature control system 146 provides a number of temperature sensors (not shown) to detect the temperature of the gas in each pipeline 143 and send the detected information to a temperature control module (not shown). The temperature control module provides control signals, according to the received temperature information, to a number of heating/cooling elements (not shown) within or near the pipelines 143 to independently adjust the temperature of the gas flowing in each pipeline 143. Therefore, the temperature of the gas supplied into each gas supply channel 115 can also be controlled or adjusted by the pressure control module 134 according to different processing requirements and/or substrate conditions, which will be illustrated in more detail later. In some embodiments, the temperature sensors may include thermocouples or other types of applicable temperature sensors. In addition, the temperature control module may include a PLC circuit, storage members (e.g. memories), and the like. In addition, the heating/cooling elements may include thermoelectric heaters/coolers or other types of applicable heating/cooling elements.

Figure 10:
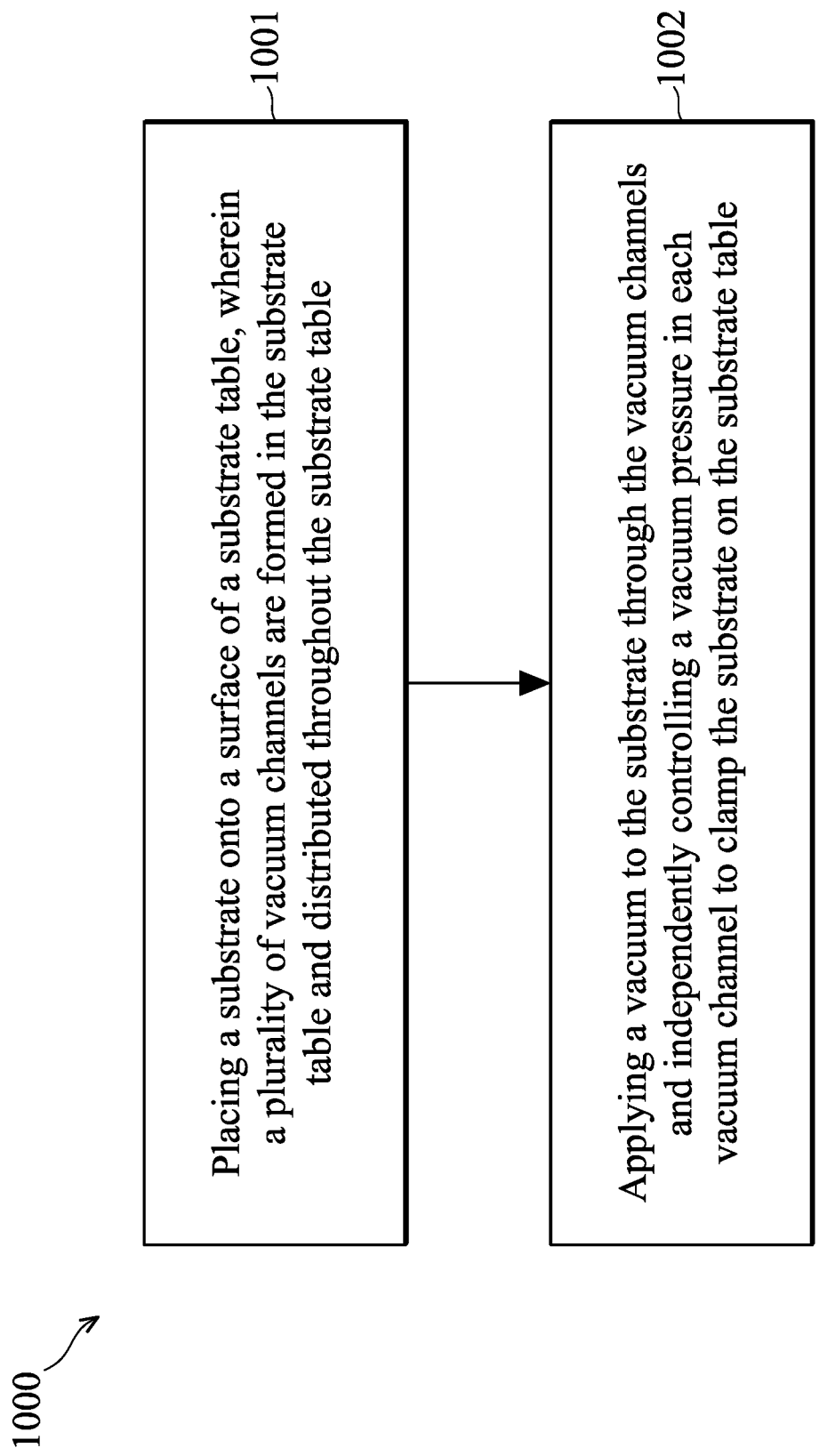
FIG. 10 is a simplified flow chart of a substrate handling method in accordance with some embodiments.

In the present disclosure, embodiments of a substrate handling method are also provided. FIG. 10 is a simplified flow chart of a substrate handling method 1000 using a substrate table system described above (e.g. the substrate table system 10 shown in FIG. 8) in accordance with some embodiments. Some of the operations described below can be replaced or eliminated in different embodiments. Alternatively, some operations may be added in different embodiments.

The substrate handling method 1000 includes operation 1001, in which a substrate W is placed onto an upper surface 110A of a substrate table 11 of the substrate table system 10, as shown in FIG. 8. In some embodiments, as shown in FIGS. 2 to 4, the substrate table 11 is provided with plurality of vacuum channels 114. The vacuum channels 114 are evenly distributed throughout the substrate table 11 (i.e. the vacuum channels 114 are uniformly formed in all regions of the substrate table 11 rather than being formed in a local region of substrate table 11) and arranged in a grid pattern. Moreover, the vacuum channels 114 are respectively formed with a vacuum opening 114A (FIG. 2B) on the upper surface 110A.

The substrate handling method 1000 further includes operation 1002, in which a vacuum is applied to the backside of the substrate W through the vacuum channels 114 and the vacuum pressure in each vacuum channel 114 is independently controlled to clamp the substrate W on the substrate table 11. In some embodiments, the substrate table system 10 provides a vacuum generation system 13 (FIG. 8) to apply a vacuum to the backside of the substrate W through the vacuum channels 114 to clamp the substrate W on the substrate table 11. In some embodiments, the vacuum generation system 13 applies different sizes of vacuum suction force to the substrate W depending on the different structure, thickness, or material of the substrate W to prevent damage to the devices on the substrate W. In some embodiments, the vacuum generation system 13 further includes a pressure control module 134 (FIG. 8) that can independently control the vacuum pressure in each vacuum channel 114 according to different processing requirements and/or substrate conditions described below, so that the substrate W clamped on the substrate table 11 is flatter.

Figure 11:
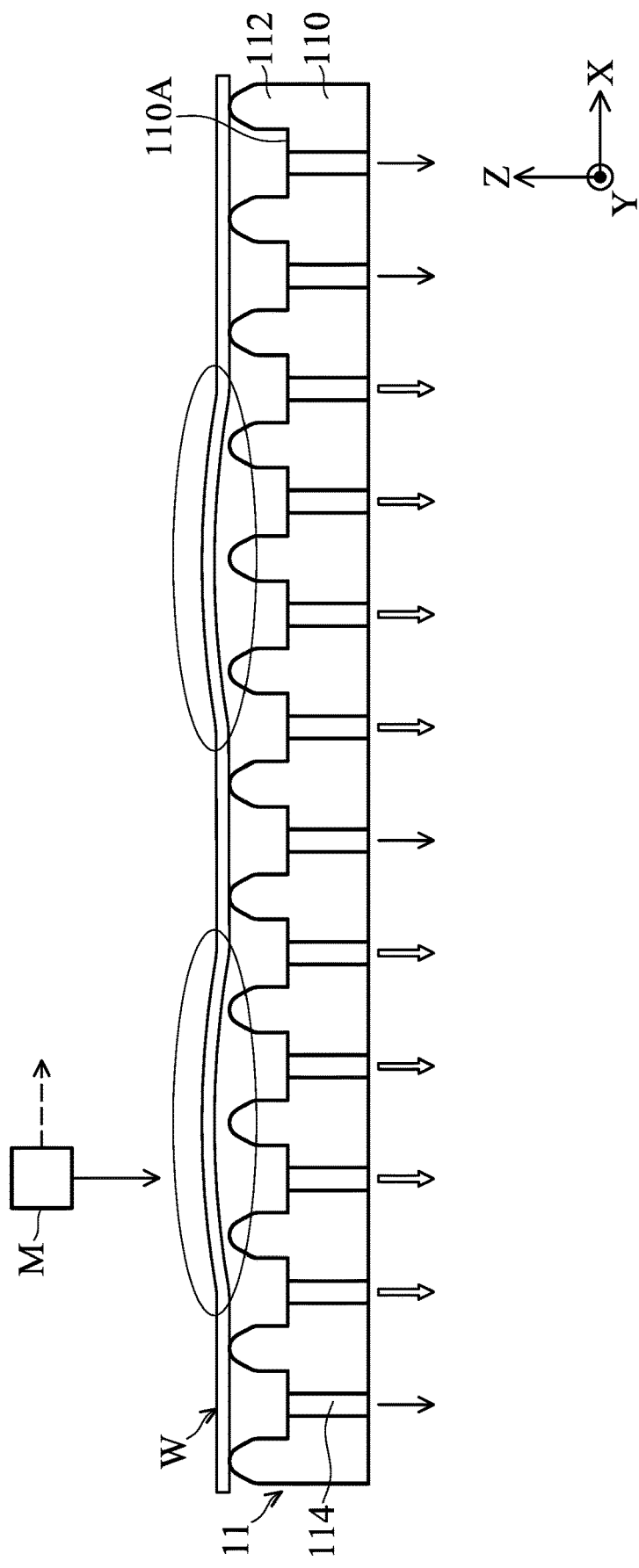
FIG. 11 schematically shows that the vacuum pressure in each vacuum channel can be controlled according to the heights of different regions of the substrate in accordance with some embodiments.

For example as shown in FIG. 11, after the substrate W is placed on the substrate table 11 and secured on the substrate table 11 by vacuum clamping provided by the vacuum generation system 13, a leveling sensor M is provided and used to measure the flatness of the substrate W (i.e. measure the height of a plurality of regions of the substrate W). In some embodiments, the leveling sensor M is an optical leveling sensor (e.g., a photodiode) that can move horizontally to scan over the entire substrate W and can receive leveling signals reflected by the substrate W. For example, the leveling signals are generated by a leveling signal source (not shown), are reflected from the substrate W, and are directed to the leveling sensor M. Accordingly, the leveling sensor M can measure the height of all regions of the substrate W (note that the height variations or irregular deformation of the substrate W may come from the thermal expansion or other mechanical stresses which occur during processing) based on the reflected leveling signals. In some embodiments, the leveling sensor M scans and measures the height of all regions of the substrate W from die-to-die or device-to-device.

Afterwards, the height information detected by the leveling sensor M is passed to the pressure control module 134 (FIG. 8) or the controller 15 (FIG. 1) that can provide feedback control signals to the pressure control module 134. The pressure control module 134 then provides control signals, according to the measured height of different regions of the substrate W, to the valves 133 to independently control the vacuum pressure in each vacuum channel 114 of the substrate table 11. For example, the pressure control module 134 can control the vacuum channels 114 corresponding to the regions of the substrate W with a relatively large height (as the circled portions depicted in FIG. 11) to provide a larger vacuum pressure/suction force to lower such regions of the substrate W, as shown in FIG. 11. As a result, the flatness of the substrate W held on the substrate table 11 is improved, and the yield of the process P (FIG. 1) performed on the substrate W is also improved.

Figure 12:
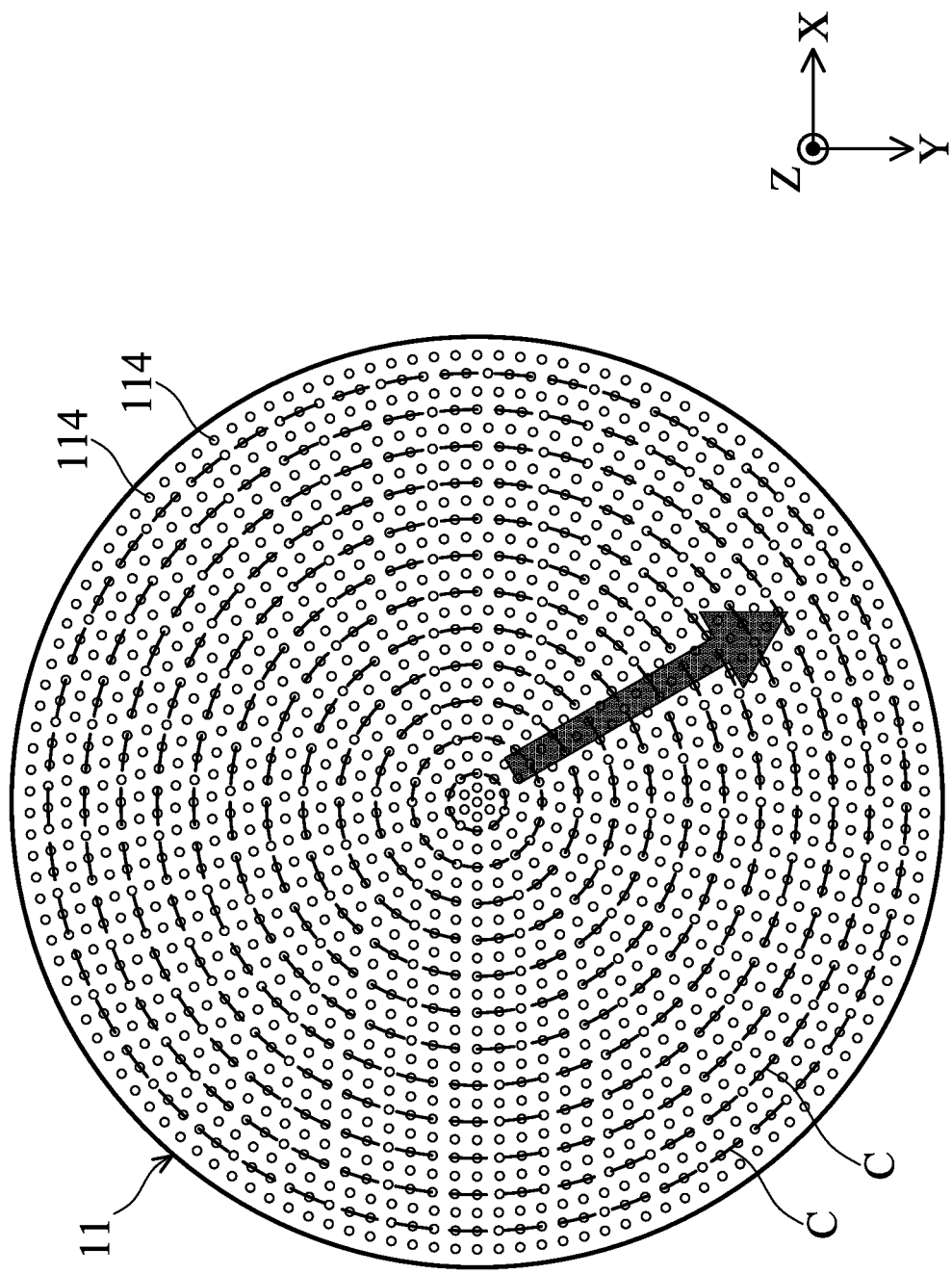
FIG. 12 schematically shows that the vacuum pressure in each vacuum channel can be controlled to apply a vacuum in sequence in a radial direction from the center to the edge of the substrate in accordance with some embodiments.

In other some embodiments, as shown in FIG. 12, the vacuum pressure in each vacuum channel 114 can also be independently controlled by the pressure control module 134 (FIG. 8) to apply or activate a vacuum in sequence in a radial direction from the center to the edge of the substrate W (not shown in FIG. 8). For example, the vacuum channels 114 of the substrate table 11 may be grouped into a plurality of concentric circles C, and the pressure control module 134 can control the groups of vacuum channels 114 (i.e. control the corresponding valves 133) to apply a vacuum in sequence in a radial direction from the center to the edge of the substrate W (as the arrow depicted in FIG. 12). In this way, it also helps the entire substrate W to be successfully clamped on the substrate table 11.

In cases where the substrate table (e.g. the substrate table 11' in FIG. 9) further includes a plurality of gas supply channels 115 provided between the vacuum channels 114 and evenly distributed throughout the substrate table 11', the substrate handling method 1000 further includes an operation of independently controlling the gas supply pressure in each gas supply channel 115 to supply a gas to the substrate W.

In some embodiments described above, the substrate table system 10 (FIG. 9) also provides a gas supply system 14 to supply a gas (e.g., a process gas or a heat transfer gas described above or another applicable gas) to the backside of the substrate W while it is clamped on the substrate table 11'. The gas supply system 14 may further include a pressure control module 145 that can independently control the gas supply pressure in each gas supply channel 115 to supply a gas to manipulate the substrate W based on processing requirements. For example, the pressure control module 145 can control the gas supply pressure in each gas supply channel 115 to be consistent, so that the gas from the gas supply system 14 is uniformly directed or dispensed to the entire backside of the substrate W through the gas supply channels 115.

However, it should be appreciated that many variations and modifications can be made to the embodiments of the disclosure. In some embodiments, the gas supply channels 115 may also be grouped into zones or areas, and the pressure control module 145 can control the groups of gas supply channels 115 ((i.e. control the corresponding valves 144) having the same gas supply pressure. For example, each group of the gas supply channels 115 may correspond to a die on the substrate W.

In some embodiments, the substrate handling method 1000 further includes operations of measuring the temperature of a plurality of regions of the substrate W placed on the substrate table 11' and independently controlling the temperature of the gas (e.g. a heat transfer gas) supplied into each gas supply channel 115 according to the measured temperature of different regions of the substrate W.

As described above, one of more temperature sensors (not shown in the figures) may be positioned at one or more locations on or within the substrate table 11' and can be coupled to the controller 15 (FIG. 1) to provide an indication of the temperature of different portions of the substrate table 11'. The temperature of the substrate table 11' may also be used to determine the temperature of the substrate W. In addition, the gas supply system 14 may further include a temperature control system 146 (FIG. 9) that can provide control signals, according to the received temperature information from the controller 15, to a number of heating/cooling elements (not shown) within or near the pipelines 143 to independently adjust the temperature of the gas flowing in each pipeline 143 and supplied into each gas supply channel 115 for regulating the temperature of the substrate W. For example, the temperature control system 146 can adjust the temperature of the gas supplied into the gas supply channels 115 corresponding to the regions of the substrate W with a relatively low temperature to be higher (but within a desired processing temperature range), so that the substrate W held on the substrate table 11' has a uniform temperature. As a result, the yield of the process P (FIG. 1) performed on the substrate W can also be improved.

Figure 13:
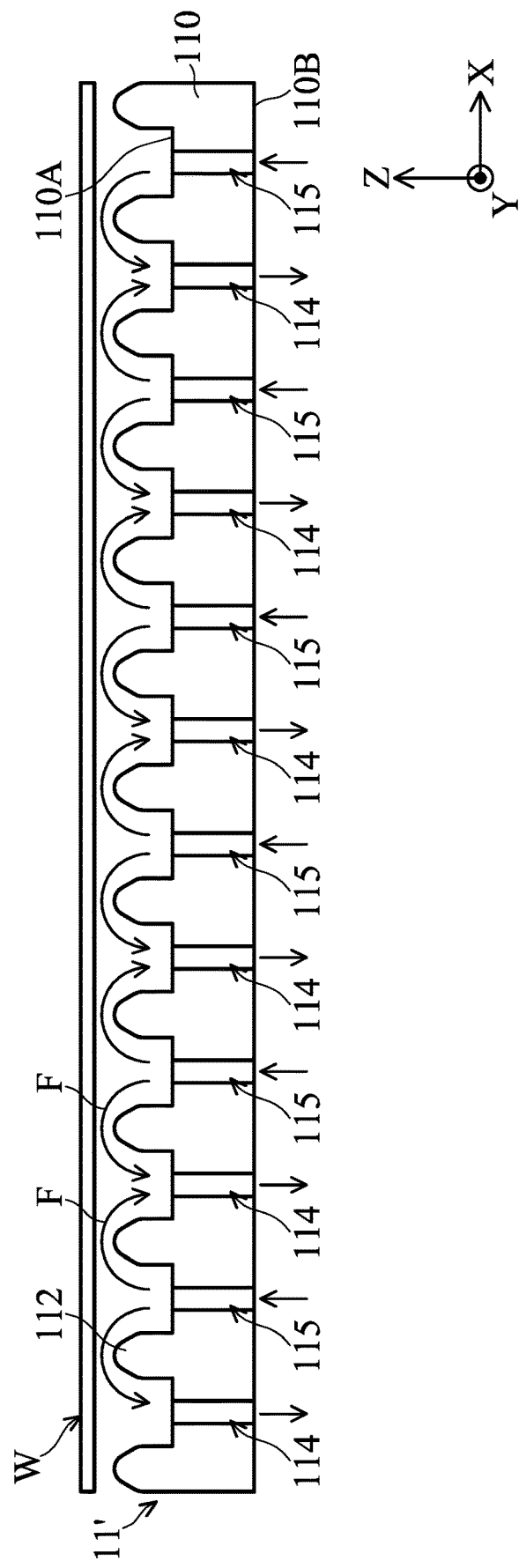
FIG. 13 schematically shows that the gas flow between adjacent vacuum channel and gas supply channel forms a gas bearing to separate the substrate from the burls on the substrate table in accordance with some embodiments.

In other some embodiments of the substrate handling method 1000, as shown in FIG. 13, the vacuum pressure in each vacuum channel 114 and the gas supply pressure in each gas supply channel 115 may be controlled such that a gas bearing F is formed between the vacuum channel 114 and the gas supply channel 115, which are adjacent to each other. For example, the vacuum pressure in each vacuum channel 114 and the gas supply pressure in each gas supply channel 115 can be controlled by the pressure control modules 134, 145 to allow the gas supplied by each gas supply channel 115 to flow through the upper surfaces of adjacent burls 112 and then to be exhausted by adjacent vacuum channels 114 (at the same time, the substrate W is still secured on the substrate table 11 by vacuum clamping via some of the vacuum channels 114 (not shown)). Accordingly, the gas flow between adjacent gas supply channels 115 and vacuum channels 114 forms gas bearings F to separate the backside of the substrate W from the upper surfaces of adjacent burls 112 to prevent damage to the substrate W and the substrate table 11' due to friction. Consequently, the quality of the substrate W is improved and the life time of substrate table 11' is prolonged.

The embodiments of the present disclosure have some advantageous features: The entire substrate table is provided with evenly distributed vacuum channels grid, so that the vacuum suction forces applied through the vacuum channels to different portions of the backside of the substrate can be consistent. Therefore, the flatness of the substrate held on the substrate table is improved and the yield of the process performed on the substrate is also improved. In addition, the vacuum pressure in each vacuum channel of the substrate table can be independently controlled according to different processing requirements and/or substrate conditions, so that the substrate clamped on the substrate table can be flatter. Furthermore, the pressure or temperature of a gas (e.g. a process gas or a heat transfer gas) supplied to the backside of the substrate through gas supply channels formed in the substrate table can also be controlled to satisfy various processing requirements.

In some embodiments, a substrate table is provided. The substrate table includes a main body having a surface and a plurality of burls extending from the surface. The burls are configured to support a substrate on the main body. The substrate table further includes a number of vacuum channels provided in the burls to apply a vacuum to the substrate. The vacuum channels are distributed throughout the main body and arranged in a grid pattern.

In some embodiments, a substrate table system is provided. The substrate table system includes a substrate table and a pressure control module. The substrate table includes a main body having a surface and a plurality of burls extending from the surface. The burls are configured to support a substrate on the main body. The substrate table further includes a plurality of vacuum channels provided in the burls to apply a vacuum to the substrate. The vacuum channels are distributed throughout the main body and arranged in a grid pattern. The pressure control module is configured to independently control the vacuum pressure in each vacuum channel.

In some embodiments, a substrate table system is provided. The substrate table system includes a substrate table and a pressure control module. The substrate table includes a main body having a surface and a plurality of burls extending from the surface. The burls are configured to support a substrate on the main body. The substrate table further includes a plurality of vacuum channels provided in the burls to apply a vacuum to the substrate. The vacuum channels are distributed throughout the main body and arranged in a grid pattern. The substrate table also includes a plurality of gas supply channels provided in the main body and respectively formed with a gas supply opening on the surface. The gas supply channels are configured to supply a gas to the substrate. The gas supply channels are distributed throughout the main body and formed between the burls, and the vacuum channels and the gas supply channels are alternately arranged. The pressure control module is configured to independently control the vacuum pressure in each vacuum channel.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A substrate table, comprising:
a main body having a surface and a plurality of burls extending from the surface, wherein the burls are configured to support a substrate on the main body;
a plurality of vacuum channels provided in the burls, configured to apply a vacuum to the substrate, wherein the vacuum channels are distributed throughout the main body and arranged in a grid pattern, wherein the vacuum channels are uniformly formed in all regions of the main body, and the all regions of the main body comprise a central region and a periphery region connected to the central region and close to an edge of the main body; and a plurality of gas supply channels provided in the main body and respectively having a gas supply opening exposed from the surface, configured to supply a gas to the substrate, wherein the gas supply channels are formed between the burls and between the vacuum channels.

2. The substrate table as claimed in claim 1, wherein the periphery region surrounds the central region.

3. The substrate table as claimed in claim 1, wherein each of the vacuum channels has a vacuum opening formed on the top surface of the respective burl.

4. The substrate table as claimed in claim 3, wherein the vacuum channels extend from the top surfaces of the burls to another surface of the main body opposite to the surface having the burls.

5. The substrate table as claimed in claim 1, wherein each of the vacuum channels has a vacuum opening formed on a sidewall of the respective burl and facing in a direction different from an extending direction in which the burl extends.

6. The substrate table as claimed in claim 1, wherein the gas supply channels are evenly distributed throughout the main body and arranged in a grid pattern.

7. The substrate table as claimed in claim 1, wherein each vacuum channel of the plurality of vacuum channels is vertically aligned with the respective burl.

8. The substrate table as claimed in claim 1, wherein each vacuum channel of the plurality of vacuum channels has a vacuum opening formed on the top surface of the respective burl, and the vacuum opening is higher than the gas supply opening.

9. The substrate table as claimed in claim 1, wherein the vacuum channels and the gas supply channels are alternately arranged.

10. A substrate table system, comprising:
a substrate table, comprising:
a main body having a surface and a plurality of burls extending from the surface, wherein the burls are configured to support a substrate on the main body;
a plurality of vacuum channels provided in the burls, configured to apply a vacuum to the substrate, wherein the vacuum channels are distributed throughout the main body and arranged in a grid pattern; and
a plurality of gas supply channels provided in the main body and respectively formed with a gas supply opening on the surface of the main body, configured to supply a gas to the substrate, wherein the gas supply channels are formed between the burls and between the vacuum channels;
a first pressure control module configured to independently control a vacuum pressure in each vacuum channel; and
a second pressure control module configured to independently control a gas supply pressure in each gas supply channel.

11. The substrate table system as claimed in claim 10, wherein the vacuum channels are uniformly formed in all regions of the main body, and the all regions of the main body comprise a central region and a periphery region connected to the central region and close to an edge of the main body.

12. The substrate table system as claimed in claim 10, wherein each of the vacuum channels has a vacuum opening formed on a top surface of the respective burl.

13. The substrate table system as claimed in claim 10, wherein each of the vacuum channels has a vacuum opening formed on a sidewall of the respective burl and facing in a direction different from an extending direction in which the burl extends.

14. The substrate table system as claimed in claim 10, wherein the gas supply channels are evenly distributed throughout the substrate table.

15. The substrate table system as claimed in claim 14, wherein the gas supplied from the gas supply channels is uniformly directed to an entire backside of the substrate.

16. The substrate table system as claimed in claim 10, further comprising a temperature control system configured to independently control a temperature of the gas supplied into each gas supply channel.

17. The substrate table system as claimed in claim 16, further comprising one or more temperature sensors configured to measure temperatures of a plurality of regions of the substrate on the substrate table, wherein the temperature control system is configured to independently control the temperature of the gas supplied into each gas supply channel according to the measured temperatures of different regions of the substrate.

18. The substrate table system as claimed in claim 10, further comprising a leveling sensor configured to measure heights of a plurality of regions of the substrate on the substrate table, wherein the first pressure control module is configured to independently control the vacuum pressure in each vacuum channel according to the measured heights of different regions of the substrate.

19. A substrate table system, comprising:
a substrate table, comprising:
a main body having a surface and a plurality of burls extending from the surface, wherein the burls are configured to support a substrate on the main body;
a plurality of vacuum channels provided in the burls, configured to apply a vacuum to the substrate, wherein the vacuum channels are distributed throughout the main body; and
a plurality of gas supply channels provided in the main body and respectively formed with a gas supply opening on the surface, configured to supply a gas to the substrate, wherein the gas supply channels are distributed throughout the main body and formed between the burls, and wherein the vacuum channels and the gas supply channels are alternately arranged;
a pressure control module configured to independently control a vacuum pressure in each vacuum channel; and
a second pressure control module configured to independently control a gas supply pressure in each gas supply channel.

20. The substrate table system as claimed in claim 19, wherein the vacuum channels and the gas supply openings are uniformly formed in all regions of the main body, and the all regions of the main body comprise a central region and a periphery region surrounding the central region and close to an edge of the main body.

* * * * *